(12) United States Patent
Verschuuren

(10) Patent No.: US 11,338,477 B2
(45) Date of Patent: May 24, 2022

(54) POLYORGANOSILOXANE-BASED STAMP MANUFACTURING METHOD, POLYORGANOSILOXANE-BASED STAMP, USE OF THE SAME FOR A PRINTING PROCESS, AND AN IMPRINTING METHOD USING THE SAME

(71) Applicant: KONINKLIJKE PHILIPS N.V., Eindhoven (NL)

(72) Inventor: Marcus Antonius Verschuuren, Berkel-Enschot (NL)

(73) Assignee: Koninklijke Philips N.V., Eindhoven (NL)

( * ) Notice: Subject to any disclaimer, the term of this patent is extended or adjusted under 35 U.S.C. 154(b) by 427 days.

(21) Appl. No.: 16/318,848

(22) PCT Filed: Jul. 27, 2017

(86) PCT No.: PCT/EP2017/069098
§ 371 (c)(1),
(2) Date: Jan. 18, 2019

(87) PCT Pub. No.: WO2018/019971
PCT Pub. Date: Feb. 1, 2018

(65) Prior Publication Data
US 2019/0283280 A1    Sep. 19, 2019

(30) Foreign Application Priority Data

Jul. 27, 2016    (EP) .................................... 16181454

(51) Int. Cl.
*B29C 35/02*   (2006.01)
*B29C 33/38*   (2006.01)
(Continued)

(52) U.S. Cl.
CPC ........ *B29C 33/3857* (2013.01); *B29C 33/405* (2013.01); *B29C 33/424* (2013.01);
(Continued)

(58) Field of Classification Search
CPC .... G03F 7/002; B29C 2033/426; B29C 35/02
See application file for complete search history.

(56) References Cited

U.S. PATENT DOCUMENTS

| 5,817,242 A | 10/1998 | Biebuyck et al. |
| 6,976,424 B2 | 12/2005 | Bruno et al. |

(Continued)

FOREIGN PATENT DOCUMENTS

CN    102875811    *   7/2011

OTHER PUBLICATIONS

Platinum—Catalyzed Hydrosilation in Polymer Chemistry, Polymers, p. 3, (Year: 2020).*

(Continued)

*Primary Examiner* — Alison L Hindenlang
*Assistant Examiner* — Debjani Roy

(57) ABSTRACT

Disclosed is a method of manufacturing a polyorganosiloxane-based stamp comprising providing a master including a transfer pattern surface; forming a first layer of a first curable composition onto the transfer pattern surface such that the first layer includes a relief pattern of said transfer pattern; partially curing the first layer; depositing a second layer of a second curable composition onto the partially cured first layer; co-curing the partially cured first layer and the second layer to form a cured first layer having a first Young's modulus, adhered to a cured second layer having a second Young's modulus smaller than the first Young's modulus; depositing a third layer of a third curable composition onto the second layer, and curing the third layer to form a cured third layer adhered to the cured second layer. Further disclosed is a polyorganosiloxane-based stamp obtainable from the method; use of the same for printing process; and an imprinting method using the same.

18 Claims, 7 Drawing Sheets

(a)

(c)

(b)

(d)

(51) Int. Cl.
    *B29C 33/40*       (2006.01)
    *B29C 33/42*       (2006.01)
    *G03F 7/00*        (2006.01)

(52) U.S. Cl.
    CPC ............ *B29C 35/02* (2013.01); *G03F 7/0002* (2013.01); *B29C 2033/385* (2013.01); *B29C 2033/426* (2013.01); *B29K 2883/00* (2013.01); *B29K 2883/005* (2013.01)

(56) References Cited

U.S. PATENT DOCUMENTS

| | | | |
|---|---|---|---|
| 7,195,733 | B2 | 3/2007 | Rogers et al. |
| 7,256,435 | B1* | 8/2007 | Kornilovich .......... B81C 99/009 |
| | | | 257/208 |
| 7,927,976 | B2 | 4/2011 | Menard |
| 9,908,358 | B2 | 3/2018 | Van Brakel et al. |
| 11,086,217 | B2* | 8/2021 | Van Brakel ......... G03F 7/70241 |
| 2007/0203317 | A1* | 8/2007 | Verbruggen ............ C08L 83/04 |
| | | | 528/37 |
| 2008/0011934 | A1 | 1/2008 | Verschuuren et al. |
| 2009/0283937 | A1* | 11/2009 | Kodama ................ G03F 7/027 |
| | | | 264/447 |
| 2011/0094403 | A1 | 4/2011 | Verschuuren |
| 2016/0152064 | A1* | 6/2016 | Van Brakel ............... B41F 7/00 |
| | | | 101/450.1 |

OTHER PUBLICATIONS https://siliconecloth.com/index.php/the-characteristics-of-silicone-rubber/ Fiberglass fabric coated with silicon rubber (Year: 2021).*

\* cited by examiner (e)

(f)

(g)

POLYORGANOSILOXANE-BASED STAMP MANUFACTURING METHOD, POLYORGANOSILOXANE-BASED STAMP, USE OF THE SAME FOR A PRINTING PROCESS, AND AN IMPRINTING METHOD USING THE SAME

CROSS-REFERENCE TO PRIOR APPLICATIONS

This application is the U.S. National Phase application under 35 U.S.C. § 371 of International Application No. PCT/EP2017/069098, filed on Jul. 27, 2017, which claims the benefit of EP Patent Application No. EP 6181454.6, filed on Jul. 27, 2016. These applications are hereby incorporated by reference herein.

FIELD OF THE INVENTION

The present invention relates to a method of manufacturing a polyorganosiloxane-based stamp.

The present invention further relates to such a polyorganosiloxane-based stamp.

The present invention still further relates to use of the polyorganosiloxane-based stamp for a printing process.

The present invention yet further relates to an imprinting method using the polyorganosiloxane-based stamp.

BACKGROUND OF THE INVENTION

Imprint lithography is a technique in which a patterned layer, such as a masking layer, is formed on a substrate such as a semiconductor substrate or as an optical layer by the deposition of a curable imprintable medium. The curable imprintable medium is subsequently patterned by imprinting the medium with a patterned stamp, after which the curable imprintable medium is solidified e.g. when exposed to light, e.g. UV-light to initiate the curing reaction in the medium. After the curing reaction is completed, the stamp is removed from the medium to leave a patterned layer, e.g. on the semiconductor substrate or on a carrier of such an optical layer.

This technique has recently drawn considerable attention because it can potentially provide a significant cost reduction over traditional lithography process steps. In addition to imprinting planar surfaces, imprint lithography can be used for forming nanoscale patterns on so-called 2.5D surfaces, i.e. contoured surfaces, which for instance may comprise one or more protrusions, e.g. curved protrusions, emanating from a mainly planar surface. Such techniques may be used to pattern photo-voltaic solar cells, nanowires, vertical (external) cavity surface emitting lasers, medical implants and so on, e.g. by creating nanoscale patterns on optical elements, e.g. lenses or on medical implants, e.g. to stimulate bone or tissue regeneration. To this end, a planar pliable patterned stamp, such as a polyorganosiloxane-based rubber-like stamp, is typically deformed onto the contoured surface such that the stamp pattern is brought into contact with the contoured surface to be patterned. An example of such a stamp is shown in US 2008/0011934 A1.

In order to attain nanoscale patterns, the stamp may comprise a patterned stamp layer comprising a polyorganosiloxane rubber material which has a sufficiently high elastic modulus to ensure faithful replication of the fine pattern when the stamp is pressed onto the surface to be printed. However, the requirement for a high elastic modulus may mean that the stamp layer is relatively brittle. For this reason, a layered stamp may be employed which comprises a thin, high elastic modulus stamp layer adhered to a softer, thicker support layer comprising a further polyorganosiloxane rubber.

The stamp layer may be fabricated by coating a first curable polyorganosiloxane composition onto a transfer pattern surface of a master followed by curing the composition. The first curable composition may comprise branched and linear reactive polyorganosiloxanes, and a catalyst for crosslinking these reactive components in order to achieve a stamp layer with the requisite high elastic modulus. A second curable polyorganosiloxane composition may be subsequently coated onto the cured stamp layer which may then be cured to form the support layer. However, the (chemical) adhesion between stamp and support layers may be poor due to the high elastic modulus, inflexible nature of the cured stamp layer discouraging or preventing inter-layer crosslinking between any residual curable groups residing in the stamp layer (i.e. proximal to the interface between the two layers) and the second curable polyorganosiloxane composition. An alternative approach may be to only partially cure the stamp layer, apply the second composition and co-cure the partially cured stamp layer and support layer such that (chemical) adhesion between the layers may be improved by formation of crosslinks between the two layers. However, such an alternative technique may result in poorer control over the Young's modulus of the stamp layer. This may result in a stamp layer having a lower elastic modulus than intended.

SUMMARY OF THE INVENTION

The present invention seeks to provide a method of manufacturing a polyorganosiloxane-based stamp with good (chemical) adhesion between a first (stamp) layer and a third (support) layer whilst maintaining a high elastic modulus of the stamp layer.

The present invention further seeks to provide a polyorganosiloxane-based stamp.

The present invention still further relates to the use of the polyorganosiloxane-based stamp.

The present invention yet further seeks to provide a method of patterning a surface using such a stamp.

The invention is defined by the claims.

According to an aspect, there is provided a method of manufacturing a polyorganosiloxane-based stamp comprising: providing a master including a transfer pattern surface; forming a first layer of a first curable composition onto the transfer pattern surface such that the first layer includes a relief pattern of said transfer pattern, the first curable composition comprising a reactive branched polyorganosiloxane, a first reactive linear polyorganosiloxane, and a first concentration of a catalyst for catalysing crosslinking of the reactive branched and first reactive linear polyorganosiloxanes, said first layer having a first thickness; partially curing the first layer; depositing a second layer of a second curable composition onto the partially cured first layer, the second curable composition comprising a second concentration of the catalyst, a second reactive linear polyorganosiloxane for forming a crosslinked second layer and for adhering the second layer to the first layer by crosslinking with reactive polyorganosiloxanes of the partially cured first layer, said second layer having a second thickness; wherein the second thickness is selected to be smaller than the first thickness and/or the second concentration is selected to be equal to or greater than the first concentration; co-curing the partially cured first layer and the second layer to form a cured first layer having a first Young's modulus, adhered to a cured second layer having a second Young's modulus smaller than the first Young's modulus; depositing a third layer of a third curable composition onto the second layer, the third curable composition comprising a third reactive polyorganosiloxane for forming a crosslinked third layer and for adhering the third layer to the cured second layer by crosslinking with the second reactive linear polyorganosiloxane; and curing the third layer to form a cured third layer adhered to the cured second layer.

The present invention is based on the realisation that poor control over the elastic modulus of the stamp layer when it is co-cured with a support layer composition deposited on the stamp layer may be due to diffusion of components from the partially cured stamp layer into the support layer composition and vice versa during co-curing. For example, the catalyst employed for curing the stamp layer may migrate to the support layer composition during co-curing which may decrease the crosslink density of the stamp layer and thus to decrease its elastic (e.g. Young's) modulus. Furthermore, diffusion of low molecular weight species from the support layer composition to the partially cured stamp layer during co-curing may further adversely influence (i.e. decrease) the Young's modulus of the cured stamp layer.

Accordingly, the present invention provides a method of manufacturing a polyorganosiloxane-based stamp, wherein a partially cured first (stamp) layer with a first thickness is coated with a second layer of a second curable composition. A high first Young's modulus of the cured first (stamp) layer may be attained by employing a first curable composition comprising both branched and linear reactive polyorganosiloxanes with a catalyst for crosslinking the reactive polyorganosiloxanes. Following partial curing of the first curable composition, a second layer of a second curable composition deposited on the partially cured first layer may become (chemically) adhered to the cured first layer during co-curing of the first layer and second layer.

The second layer has a (second) thickness which may be selected to be less than the first thickness, such that when the second layer and partially cured first (stamp) layer are co-cured, migration of components between the respective layers may be diminished or prevented. This may be due to the thinner second layer providing a small bulk or volume of material (e.g. compared to a thick support layer) to which and from which material may diffuse during co-curing of the partially cured first layer and second layer. In particular, the migration/diffusion of the catalyst, which catalyses crosslinking of the reactive branched and first reactive linear polyorganosiloxanes, from the first layer may be diminished or prevented such that a high first Young's modulus of the cured first layer may be more predictably attained. Alternatively or additionally, by selecting a second concentration of catalyst in the second layer which is equal to or exceeds the first concentration of the catalyst in the first layer, catalyst migration by diffusion from the first layer to the second layer may be diminished or prevented by flattening or removing the catalyst concentration gradient between the two layers. Selecting the second concentration to be higher than the first concentration may ensure that catalyst diffusion serves only to enrich the first layer with catalyst. In this way, a high catalyst concentration may be maintained in the first layer such that a high crosslink density and thus a high Young's modulus of the first layer may be predictably attained.

In embodiments wherein the second thickness is selected to be less than the first thickness, the second concentration may be selected to be lower than the first concentration or zero. In other words, the selection of the second thickness may be sufficient to ensure limited catalyst diffusion from the first to the second layer.

Similarly, in embodiments wherein the second concentration is selected to be equal to or higher than the first concentration, the second thickness may be selected to be equal to or exceed the first thickness. In other words, the selection of the second concentration may be sufficient to ensure limited catalyst diffusion from the first to the second layer.

In embodiments wherein both the second thickness is selected to be less than the first thickness and the second concentration is selected to be equal to or higher than the first concentration, both selections may contribute to ensuring limited catalyst diffusion from the first to the second layer.

The second layer, obtainable from curing of the second composition comprising a second reactive linear polyorganosiloxane, may have a second Young's modulus which is lower with respect to the first Young's modulus of the first (stamp) layer. Thus the second layer may be sufficiently flexible to ensure effective adhesion with the third (support) layer. The second layer may therefore be considered an adhesion layer for chemically adhering the third (support) layer to the high Young's modulus first (stamp) layer.

The cured first layer may have a thickness in the range 5-70 μm and the first Young's modulus may be in the range from 30 to 100 MPa.

A thickness in the range 5-70 μm may result in the first (stamp) layer possessing the desired characteristics. A first layer thinner than 5 μm may be adversely influenced by layers disposed on the stamp layer, a first layer thicker than 70 μm may be too thick for achieving conformal contact with a substrate during printing/imprinting.

The first layer having a Young's modulus of 30 to 100 MPa may lend the first layer sufficient rigidity for imprinting fine patterns (e.g. with nanoscale-sized features) whilst retaining sufficient pliability such that the stamp layer may be deformed onto contoured surfaces. However, a Young's modulus in this range may render the (completely) cured stamp layer insufficiently flexible for direct adhesion to the third (support) layer. Accordingly, the second layer with a lower (second) Young's modulus relative to the (first) Young's modulus of the stamp layer is required for providing a means of connecting the high Young's modulus first layer to the third (support) layer.

The second thickness may be selected to be less than the first thickness.

Selection of the second thickness to be less than the first thickness may result in diminished or negligible migration of components between the respective layers. This may be due to the thinner second layer providing a small bulk or volume of material (e.g. compared to a thick support layer) to which and from which material may diffuse during co-curing of the partially cured first layer and second layer. In particular, the migration/diffusion of the catalyst, which catalyses crosslinking of the reactive branched and first reactive linear polyorganosiloxanes, from the first layer may be diminished or prevented such that a high first Young's modulus of the cured first layer may be more predictably attained.

The second concentration may be selected to be equal to or greater than the first concentration.

By selecting a second concentration of catalyst in the second layer such that it is equal to or exceeds the first concentration of the catalyst in the first layer, catalyst migration by diffusion from the first layer to the second layer may be diminished or prevented by flattening or removing the catalyst concentration gradient between the two layers. Selecting the second concentration to be higher than the first concentration may ensure that catalyst diffusion serves only to enrich the first layer with catalyst. In this way, a high catalyst concentration may be maintained in the first layer such that a high crosslink density and thus a high Young's modulus of the first layer may be predictably attained.

The reactive branched polyorganosiloxane may comprise a vinyl functionalised branched polyorganosiloxane, a hydride functionalised branched polyorganosiloxane, or a mixture of both; and the first reactive linear polyorganosiloxane and the second reactive linear polyorganosiloxane may each comprise a mixture of a vinyl functionalised linear polyorganosiloxane and a hydride functionalised linear polyorganosiloxane; and the catalyst may comprise a hydrosilylation catalyst.

Catalyst-mediated hydrosilylation of vinyl and hydride functionalised polyorganosiloxanes may assist in attaining first and second layers with the requisite (e.g. elastic) properties. This curing method further has the advantage of not forming, or forming negligible amounts of, byproducts.

The hydrosilylation catalyst may comprise platinum; and the first and second curable compositions may further comprise a catalyst moderator comprising a cyclic vinyl functionalised polyorganosiloxane, optionally wherein the catalyst moderator may comprise a cyclic polyorganosiloxane according to Formula 1, Formula 2 or a mixture thereof.

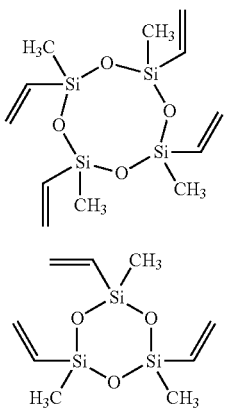

Formula 1

Formula 2

Platinum catalysts may be highly active for catalysing hydrosilylation. Use of a catalyst moderator may assist to control the crosslinking such that, for example, the first and second curable compositions do not prematurely crosslink at lower (e.g. ambient) temperatures.

The second curable composition may comprise a catalyst moderator concentration which is equal to or less than that of the first curable composition.

This may assist to limit or prevent migration/diffusion of the moderator from the second layer to the first layer such that the degree of curing, hence the Young's modulus of the first layer may not be decreased, or decreased to a more limited extent.

The reactive branched polyorganosiloxane may comprise a T-branched polyorganosiloxane, a Q-branched polyorganosiloxane, or a mixture thereof, optionally wherein the reactive branched polyorganosiloxane may comprise a polyorganosiloxane according to Formula 3, Formula 4, or a mixture thereof;

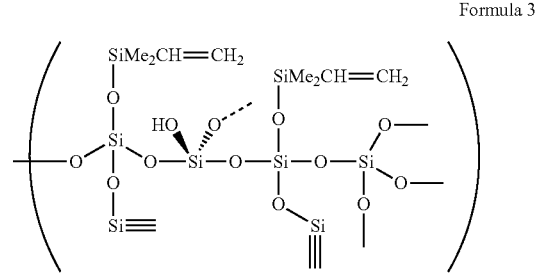

Formula 3

Formula 3 shows a single repeating unit but it should be understood that for such a Q-branched polyorganosiloxane, the number of repeating units may, for example, range from 1 to a maximum number of units such that the Q-branched polyorganosiloxane is still soluble in the reactive linear polyorganosiloxane (e.g. in the vinyl functionalised linear polyorganosiloxane) up to ratio of 1:1 by weight without phase separation at room temperature.

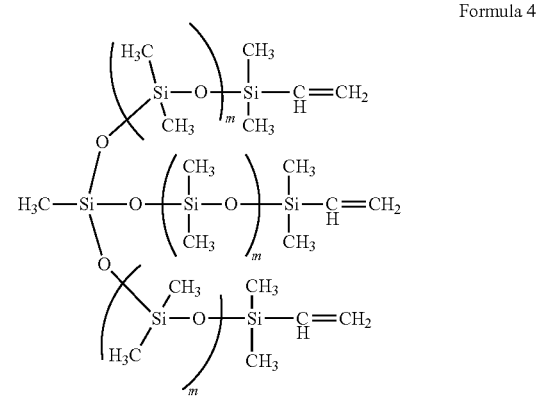

Formula 4 wherein m may, for example, range from 3 to 13. A weight-average molecular weight (Mw) as determined by gel permeation chromatography (GPC) may be between 800 and 3000 Da. It should be understood that such a technique may be employed to determine the number of repeating units in any of the herein Formulae. This may be done in combination, where required, with input from other techniques (e.g. NMR spectroscopy) for determining chemical composition (i.e. when more than one kind of repeating unit is present), as will be readily understood by the skilled person.

Inclusion of T-branched and Q-branched polyorganosiloxanes in the first curable composition may assist in attaining the desired high (first) Young's modulus of the first layer. For example, vinyl functionalised T- (e.g. Formula 4) or Q-branched (e.g. Formula 3) polyorganosiloxanes may be particularly suited to providing a high Young's modulus first layer.

The second reactive linear polyorganosiloxane may comprise a linear polyorganosiloxane comprising terminal vinyl groups, optionally the second reactive linear polyorganosiloxane may comprise a polyorganosiloxane according to Formula 5;

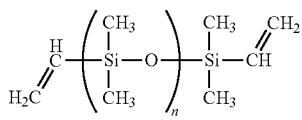

Formula 5 wherein n may, for example, range from 4 to 1000.

The second reactive linear polyorganosiloxane comprising a terminal vinylic linear polyorganosiloxane may assist in (chemical) adhesion of the second layer to the first and third layers by giving the material flexibility in the chains such that unreacted vinyl and hydride groups can reorientate themselves at an interface between these layers and react with each other. The second reactive linear polyorganosiloxane may, for example, comprise a vinyl functionalised linear polyorganosiloxane which itself comprises a terminal vinylic linear polyorganosiloxane in addition to a vinyl functionalised linear polyorganosiloxane which does not comprise terminal vinylic groups.

The second curable composition may have a lower viscosity than the first curable composition; optionally the second curable composition may further comprise a volatile diluent for decreasing the viscosity of the second curable composition and which is evaporable during the depositing of the second curable composition and/or during co-curing.

The second curable composition having a lower viscosity than the first curable composition may assist in making the second layer thinner than the first layer. Addition of a volatile diluent may assist in reducing the viscosity of the second curable composition.

The third reactive polyorganosiloxane may comprise a further mixture comprising a further vinyl functionalised linear polyorganosiloxane and a further hydride functionalised linear polyorganosiloxane, and a further hydrosilylation catalyst.

Catalyst-mediated hydrosilylation of the further mixture of vinyl and hydride functionalised polyorganosiloxanes may assist in attaining a third layer with the appropriate (e.g. elastic) properties.

The method may further comprise fixing the stamp to a rigid carrier; the third layer being disposed between the rigid carrier and the second layer.

Fixing the stamp to a rigid carrier, such as a glass carrier, may lend the stamp further structural integrity and reduce the risk of stamp deformation in the X-Y plane (i.e. the plane of the surface of the third layer receiving the carrier). The rigid carrier may, however, have some flexibility in the Z-direction to assist/accommodate pressing of the stamp in the Z direction during use.

According to another aspect, there is provided a polyorganosiloxane-based stamp obtainable from the method of any the herein embodiments, comprising a polyorganosiloxane-based first layer comprising a patterned surface opposing an inner surface, and having a first thickness; a polyorganosiloxane-based second layer disposed on the inner surface and having a second thickness smaller than the first thickness, and a polyorganosiloxane-based third layer disposed on the second layer; and wherein the Young's modulus of the first layer is higher than that of the second layer.

Such a polyorganosiloxane-based stamp may have a high Young's modulus first (stamp) layer such that the stamp may be particularly suitable for printing/imprinting a fine pattern (e.g. with nanoscale-sized features) with high fidelity, i.e. with minimal pattern deformation of the stamp during pressing the stamp against the surface to be imprinted. The stamp may further have good longevity due to the strong adhesion between the first layer and the third (support) layer via the second layer.

The Young's modulus of the first layer may be higher than that of the third layer.

A lower Young's modulus third (support) layer (relative to the higher Young's modulus first layer) may assist to compensate for the brittleness, if present, of the high Young's modulus first layer.

According to another aspect, the present invention relates to the use of a polyorganosiloxane-based stamp according to any of the herein embodiments, or obtainable from any of the manufacturing methods described herein, for a printing process, where the printing process preferably is a microcontact printing process or an imprinting process.

According to another aspect, there is provided a method of forming a patterned surface, the method comprising: providing a pattern precursor layer over a receiving substrate; imprinting the pattern precursor layer with a polyorganosiloxane-based stamp according to any of the herein embodiments; developing the pattern precursor layer into a pattern layer on the receiving substrate; and removing the patterned stamp from the developed pattern layer, wherein said receiving substrate is a planar substrate or a contoured substrate.

BRIEF DESCRIPTION OF THE DRAWINGS

Embodiments of the invention are described in more detail and by way of non-limiting examples with reference to the accompanying drawings, wherein.

DETAILED DESCRIPTION OF THE EMBODIMENTS

Figure 1:
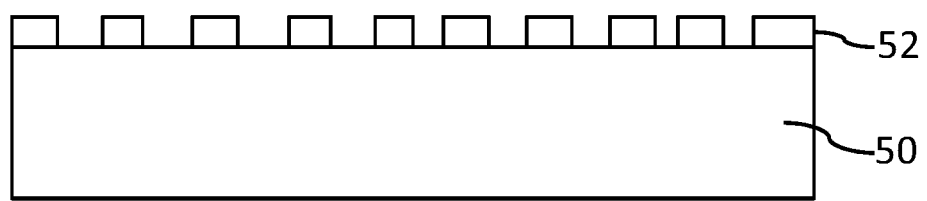
FIG. 1 schematically depicts a stamp manufacturing method according to an embodiment of the present invention.
Figure 1:
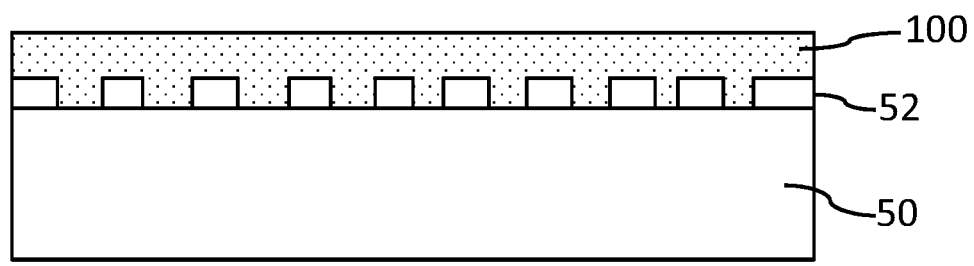
Figure 1:
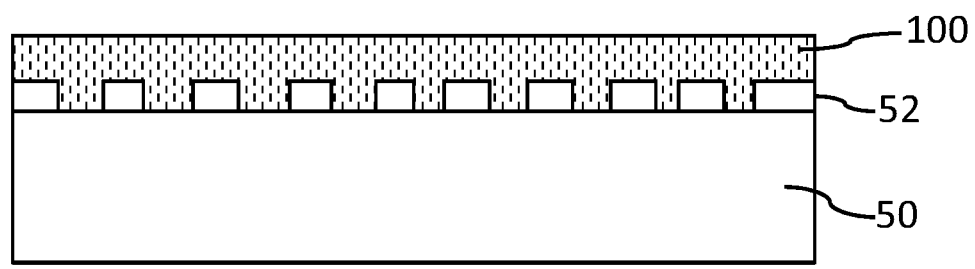
Figure 1:
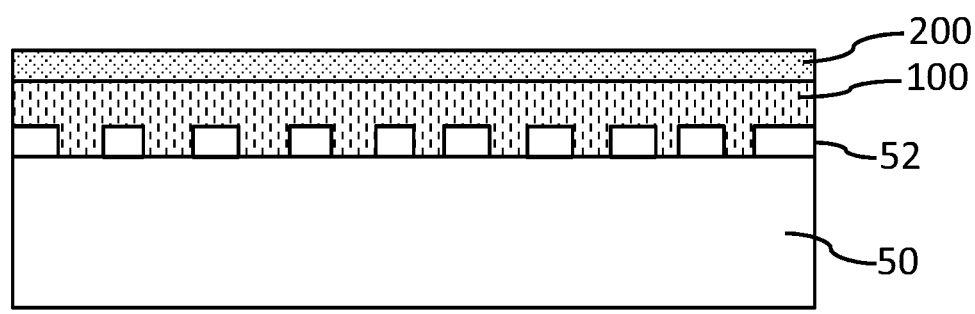
Figure 1:
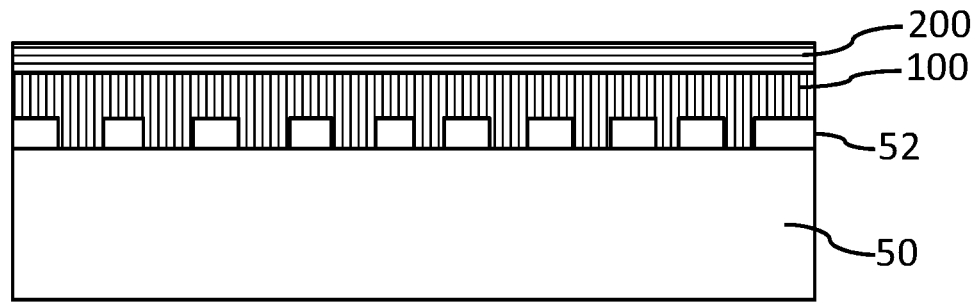
Figure 1:
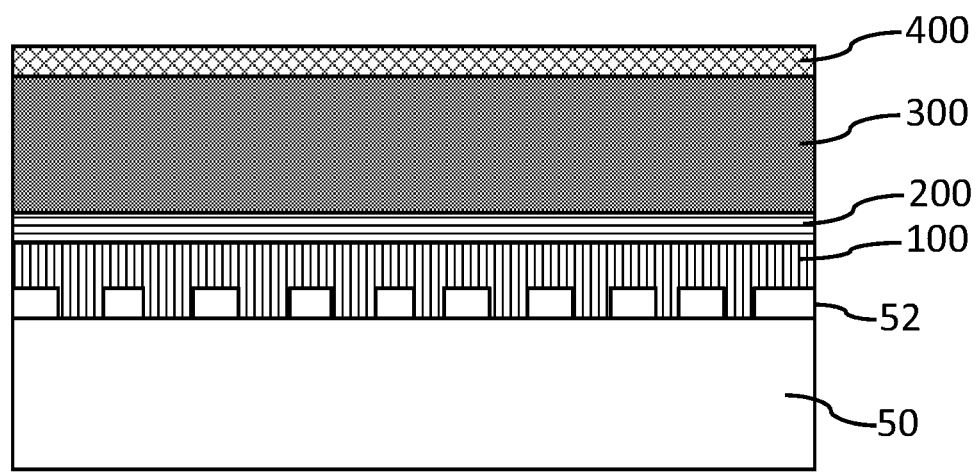
Figure 1:
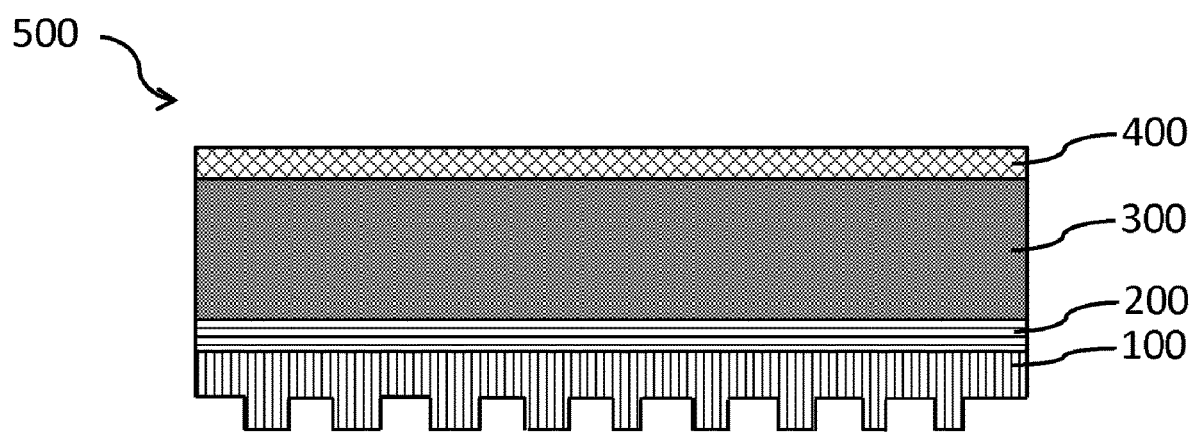

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts, unless otherwise stated.

FIG. 1 schematically depicts the various steps of a method according to an embodiment of the present invention for manufacturing a polyorganosiloxane-based stamp 500. Such a stamp 500 may be suitable for use in a soft lithography process, e.g. patterning process of contoured surfaces (e.g.

with nanoscale-sized features), as will be explained in more detail later. The term 'polyorganosiloxane-based' may, for example, refer to the stamp 500 comprising PDMS (polydimethylsiloxane) polymers, although it should be understood that similar polyorganosiloxane-based materials, e.g. a polydimethylsiloxane in which at least some of the methyl groups are replaced with larger alkyl groups, e.g. ethyl, propyl, isopropyl, butyl groups and so on, may also be contemplated.

The method commences with provision of a master 50 carrying an inverse or negative pattern 52 of features to be formed in the first (stamp) layer. Whilst FIG. 1 depicts a pattern 52 which is carried on a planar master 50, this is not intended to be limiting. Non-planar masters 50, such as a contoured master 50, may also be envisaged. A contoured master 50 may be used to manufacture a stamp 500 comprising a contoured first layer 100; such stamps may employed for printing/imprinting contoured substrates.

In step (a) of FIG. 1, a first layer 100 of a first curable composition is applied to the master mold 50 such that the negative pattern 52 is immersed by the first layer 100. The first layer 100 may be applied to the master 50 in any suitable manner, e.g. spin coating, dip coating, casting, ink jet printing and so on. The pattern 52 may, for example, be modified such that chemical adhesion with the (cured) first layer 100 may be diminished or prevented in order assist in later removal of the (cured) first layer 100 from the master 50. This may be achieved by, for example, depositing a thin layer of a fluorosilane on the pattern before applying the first curable composition. Such means of modifying the pattern 52 are well-known per se and will not be further described herein for the sake of brevity only.

In an embodiment, the first curable composition may comprise a reactive branched polyorganosiloxane, a first reactive linear polyorganosiloxane, and a catalyst for catalysing crosslinking (curing) of the reactive polyorganosiloxanes. The first layer 100 is partially cured in step (b) as schematically represented by the change in the pattern in the first layer 100. Partial curing of the first layer 100 may comprise formation of crosslinks between reactive polyorganosiloxanes but not to the extent that the first layer 100 becomes completely cured such that the completely cured (first) Young's modulus is already attained during the partial curing step. The partially cured first layer 100 may, for example, be partially cured such that a thick gel-like/soft-solid state is attained with a lower Young's modulus than the completely cured (first) Young's modulus of the first layer 100. The partial curing may also lead to the partially cured first layer 100 being tacky to the touch.

Complete curing of the first layer 100 in step (b) is to be avoided given that (chemical) adhesion to the second layer 200 (or any further supporting layer) may be precluded or rendered less effective due to the inflexibility of the completely cured first layer 100. Without wishing to be bound by any particular theory, the completely crosslinked structure of a completely cured first layer 100 may limit the availability of reactive (curable) functional groups located in portions of the first layer 100 proximal to the surface of the first layer 100 which is closer to the second layer 200. Thus adhesion of a completely cured first layer 100 to the second layer 200 (or any further layer disposed on the first layer 100) may not be as effective as the (chemical) adhesion attained by co-curing of the partially cured first layer 100 and the second layer 200, due to the greater flexibility of the partially cured first layer 100.

The partial curing of step (b) may, for example, take place in a temperature range of 30-70° C. for a time period between 30 seconds and 30 minutes.

In this regard, step (c) of FIG. 1 schematically depicts deposition of a second layer 200 of a second curable composition on the partially cured first layer 100. The second layer 200 may be applied to the partially cured first layer 100 in any suitable manner, e.g. spin coating, dip coating, casting, ink jet printing and so on.

The partially cured first layer 100 and the second layer 200 are co-cured in step (d) as schematically represented by the change in the patterns of the respective layers. This co-curing may result in effective (chemical) adhesion between the first layer 100 and the second layer 200 due to inter-layer crosslinking between the reactive polyorganosiloxanes in the respective layers (i.e. at an interface between the first layer 100 and the second layer 200).

The first layer 100 may have a thickness of no more than a few mm, e.g. 1 mm or less to ensure that the first (stamp) layer has the desired pliability characteristics. In an embodiment, the cured first layer 100 may have a thickness in the range 5-70 μm. A thickness in this range may result in the first (stamp) layer possessing the desired pliability characteristics. For the avoidance of doubt it is clarified that the thickness of the first (stamp) layer is defined as the combination of the thickness of its bulk material and the height of the features.

In an embodiment, the first Young's modulus of the cured first layer 100 is in the range from 30 to 100 MPa which may allow the first layer 100 sufficient rigidity to enable printing/imprinting of fine patterns (e.g. with nanoscale-sized features). This may be particularly important for application of the stamp 500 in imprint lithography. For the avoidance of doubt, it is noted that the Young's moduli referred to herein are determined by a standardised hardness test according to the ASTM D1415-06(2012) standard by penetrating the rubber material with a rigid ball under the conditions mandated by the standard.

The high Young's modulus of the first layer 100 may be due to the provision of both branched and linear reactive polyorganosiloxanes in the first curable composition. The concentration of the branched reactive polyorganosiloxane in the first curable composition may, for example, range between 25 and 40 wt. %, such as between 30 and 40 wt. %. The concentration of the linear reactive polyorganosiloxane in the first curable composition may, for example, range between 55 and 75 wt. %.

Curing the first curable composition may therefore comprise formation of crosslinks between branched reactive polyorganosiloxanes, between linear reactive polyorganosiloxanes, and between branched and linear reactive polyorganosiloxanes. The high Young's modulus of the first layer 100 may therefore be attributed to the highly networked polymeric structure arising from the use of the branched reactive polyorganosiloxane in combination with a linear reactive polyorganosiloxane in the first curable composition.

The co-curing of step (d) may, for example, take place in a temperature range of 50-120° C. for a time period between 10 minutes and 4 days.

In an embodiment, the reactive branched polyorganosiloxane may comprise a vinyl functionalised branched polyorganosiloxane, a hydride functionalised branched polyorganosiloxane, or a mixture of both; and the first reactive linear polyorganosiloxane may comprise a mixture comprising a vinyl functionalised linear polyorganosiloxane and a hydride functionalised linear polyorganosiloxane; wherein the catalyst for crosslinking the reactive polyorganosiloxanes is a hydrosilylation catalyst. In such an embodiment, the crosslinking of the first curable composition may comprise crosslinking involving the vinyl and hydride groups of the polyorganosiloxanes using a hydrosilylation catalyst. The hydrosilylation catalyst may comprise a platinum catalyst, such as a Karstedt catalyst. Alternative hydrosilylation catalysts, e.g. comprising rhodium or ruthenium, are also well-known per se and will not be further described herein for the sake of brevity only. The hydrosilylation catalyst may, for example, be employed in a concentration such that the concentration of metal (e.g. platinum) is less than 0.15 wt. %, such as 0.01-0.06 wt. %, of the first curable composition.

The concentration of the vinyl functionalised (branched and linear) polyorganosiloxanes in the first curable composition may, for example, range between 65 and 85 wt. %. The concentration of the hydride functionalised polyorganosiloxane in the first curable composition may, for example, range between 20 and 30 wt. %, such as between 23 and 27 wt. %.

In an embodiment, the first curable composition may comprise a catalyst moderator which may assist to control the crosslinking such that, for example, the first curable composition does not prematurely crosslink at lower (e.g. ambient) temperatures. Such a catalyst moderator in other words moderates (reduces) the catalytic activity of the catalyst. In an embodiment, the catalyst moderator may comprise a cyclic vinyl functionalised polyorganosiloxane, such as a cyclic polyorganosiloxane according to Formula 1, Formula 2 or a mixture thereof. Preferably the catalyst moderator comprises a cyclic polyorganosiloxane according to Formula 1.

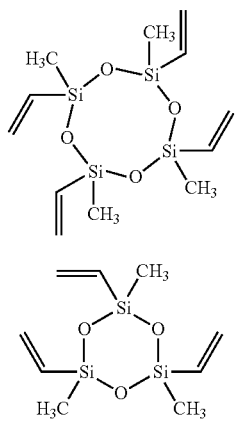

Formula 1

Formula 2

Inclusion of such a catalyst moderator in the first curable composition may assist forming of the first layer 100 on the transfer pattern surface by preventing or limiting crosslinking during forming of the first layer 100. Furthermore, the first curable composition comprising a moderator may further assist to control the partial curing of the first layer 100 such that the partial curing may not be allowed to proceed to such an extent that subsequent (chemical) adhesion to the second layer 200 during the co-curing may be compromised. The moderator may, for example, be employed in a concentration of less than 5 wt. %, such as between 1.5 and 4.0 wt. %, of the first curable composition.

The first curable composition may, in an embodiment, comprise a vinyl functionalised linear polyorganosiloxane, e.g. comprising a vinyl functionalised linear polyorganosiloxane according to Formula 6. The vinyl functionalised linear polyorganosiloxane may be, for example, at least 5% vinyl functional, for example, 5-10% vinyl functional or 6-8% vinyl functional. The percentage should be understood as referring to the fraction of silicon atoms in the linear polyorganosiloxane which are vinyl functional (the hydride percentage of the hydride functionalised polyorganosiloxane should be similarly interpreted).

The branched and linear vinyl functionalised polyorganosiloxanes, for example in a ratio of 30:70 to 70:30, may be combined with a hydride functionalised linear polyorganosiloxane, e.g. comprising a hydride functionalised linear polyorganosiloxane according to Formula 7. The hydride functionalised linear polyorganosiloxane may be, for example, at least 25% hydride functional, for example, 25-55% hydride functional or 30-60% hydride functional.

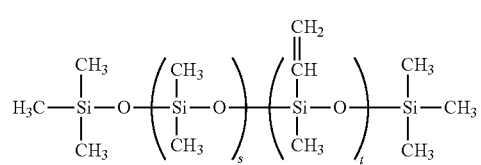

Formula 6 wherein s may, for example, range from 100 to 600; t may, for example, range from 5 to 70. The % vinyl functionality (referred to above) for Formula 6 may be calculated from: $(t/(s+t+2))\times 100$.

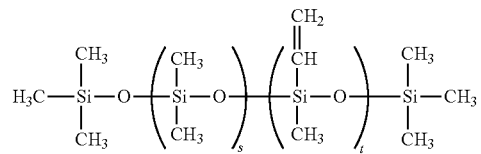

Formula 7 wherein p may, for example, range from 5 to 20; q may, for example, range from 5 to 20. The % hydride functionality (referred to above) for Formula 7 may be calculated from: $(p/(p+q+2))\times 100$.

In an embodiment, the reactive branched polyorganosiloxane may comprise a Q-branched reactive polyorganosiloxane, for example a Q-branched vinyl functionalised polyorganosiloxane (e.g. according to Formula 3), a T-branched reactive polyorganosiloxane, for example a T-branched vinyl functionalised polyorganosiloxane (e.g. according to Formula 4), or a mixture thereof. It is noted for the avoidance of doubt that a T-branched polyorganosiloxane comprises 3-way branching chains, i.e. networks, for instance when crosslinked by linear polyorganosiloxanes. Likewise, a Q-branched polyorganosiloxane comprises 4-way branching chains, i.e. networks, for instance when crosslinked by linear polyorganosiloxanes.

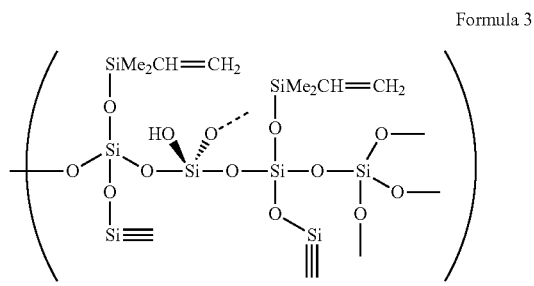

Formula 3

Formula 3 shows a single repeating unit but it should be understood that for such a Q-branched polyorganosiloxane, the number of repeating units may, for example, range from 1 to a maximum number of units such that the Q-branched polyorganosiloxane is still soluble in the reactive linear polyorganosiloxane (e.g. in the vinyl functionalised linear polyorganosiloxane) up to ratio of 1:1 by weight without phase separation at room temperature. The Q-branched resin according to Formula 3 is commercially available from Gelest, Inc. as 'Vinyl Q Resin' and from abcr GmbH as 'Vinyl modified Q silica resin'. This may, for example, be provided as a 50 wt. % dispersion in xylene. The xylene may be substantially evaporated, leaving the neat Vinyl Q resin which may be employed in the first curable composition.

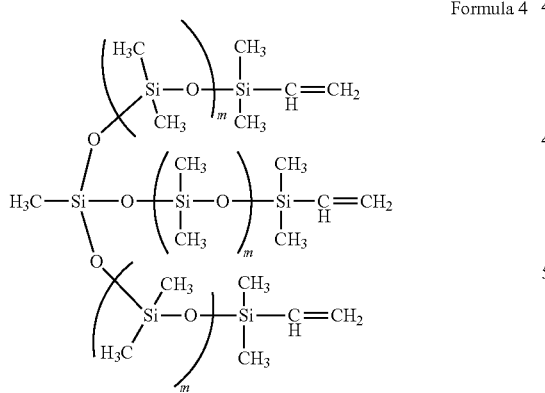

Formula 4 wherein m may, for example, range from 3 to 13. A weight-average molecular weight (Mw) as determined by gel permeation chromatography (GPC) may be between 800 and 3000 Da.

In a preferred embodiment, the first curable composition comprises a Q-branched polyorganosiloxane, such as the vinyl functionalised Q-branched polyorganosiloxane according to Formula 3. The three lines extending from the lowest two Si atoms in Formula 3 indicate that these Si atoms are each connected to three polyorganosiloxane chains as is the Si atom to the far right of Formula 3. For the avoidance of doubt, these lines do not indicate a Si≡C bond.

Whilst Formula 3 and Formula 4 respectively depict Q-branched and T-branched vinyl functionalised polyorganosiloxanes, this is not intended to be limiting. The requisite network structure of the first layer 100 may, for example, alternatively be achieved using Q-branched and/or T-branched hydride functionalised polyorganosiloxanes. In such an example, the hydride functionalised branched polyorganosiloxanes may be crosslinked via a vinyl functionalised linear polyorganosiloxane.

In non-limiting examples, the first curable composition may further comprise a diluent which may assist in controlling the viscosity of the first curable composition such that it may be easily applied to the master mold 50 to form the first layer 100. The concentration of the diluent in the first curable composition may, for example, range between 0 and 4 wt. %. The diluent may, for example, comprise hexamethyldisiloxane.

An non-limiting example of a first curable composition is provided in Table 1. The concentrations in Table 1 are relative to the total weight of the first curable composition.

TABLE 1

| Vinyl functionalised linear polyorgano- siloxanes | Vinyl- functionalised branched polyorgano- siloxanes | Hydride- functionalised linear polyorgano- siloxanes | Moderator | Catalyst (metal content) | Diluent |
|---|---|---|---|---|---|
| 33-45 wt. % | 25-40 wt. % | 23-27 wt. % | 1.5-4.0 wt. % | 0.01-0.06 wt. % | 0-4.0 wt. % |

Upon curing of the first curable composition, the hydride functionalised linear polyorganosiloxane may form crosslinks between the vinyl functionalised linear polyorganosiloxanes, between the vinyl functionalised branched polyorganosiloxanes, and between linear and branched vinyl functionalised polyorganosiloxanes such that a highly networked structure is attained. Such a highly networked structure may result in the aforementioned high Young's modulus required for the cured first layer 100.

In an embodiment, the first layer 100 has a first thickness and the second layer 200 has a second thickness which is smaller than the first thickness. Limiting the thickness of the second layer 200 such that it is smaller than the thickness of the first layer 100 may permit the desired high first Young's modulus of the first layer 100 to be more easily attained. Without wishing to be bound by any particular theory, limiting the second thickness in this way may limit the amount of components migrating between the first layer 100 and second layer 200. This may be due to the thin second layer 200 providing a small bulk or volume to which and from which material may diffuse during co-curing (step (d)) of the partially cured first layer 100 and second layer 200. For example, low molecular weight polyorganosiloxane material may diffuse from the second layer 200 to the (partially cured) first layer 100 which may, if the thickness of the second layer 200 were not restricted in this way, result in a lower Young's modulus of the first layer 100 than anticipated/desired. This may be ascribed to a thicker second layer 200 comprising a larger amount of low molecular weight material which may diffuse to the first layer 100. In particular, migration of the catalyst which catalyses cross-linking of the reactive branched and first reactive linear polyorganosiloxanes from the first layer 100 to the second layer 200 may result in a lower crosslink density of the first layer 100. This effect may be prevented or diminished by employing such a thinner second layer 200, with a (second) thickness smaller than the (first) thickness of the first layer 100, such that the second layer 200 may offer a smaller bulk into which the catalyst may diffuse. In this way less catalyst may diffuse from the first layer 100 to the thin second layer 200, the crosslink density of the first layer 100 may be maintained, and therefore a high first Young's modulus of the cured first layer 100 may be more predictably attained.

A higher catalyst concentration in the second layer 200 may also not be detrimental in terms of the handling time after preparing (i.e., mixing the components of) the second curable composition. As compared to the first layer 100 layer, which initially has a higher cross-link degree due to comprising branched polyorganosiloxanes and therefore the material reaches the gel-point sooner, a higher catalyst concentration (and a lower moderator concentration) is possible in the second curable composition given that it may comprise mostly linear polyorganosiloxanes. Thus a higher catalyst concentration may be used in the second curable composition while still retaining a sufficiently long handling time.

In an embodiment, a first concentration of the catalyst (in the first layer 100) is used, and a second concentration of the catalyst (in the second layer 200) is used which is equal to or greater than the first concentration. This may reduce the driving force of migration (diffusion) of the catalyst in the first layer 100 to the second layer 200 by removing the catalyst concentration gradient between the two layers, or by ensuring a higher catalyst concentration is in the second layer 200 such that catalyst diffusion may serve only to enrich the first layer 100 with catalyst. In this way, the crosslink density of the first layer 100 may not be reduced by the presence of the (bulk of the) second layer 200. Accordingly, the Young's modulus of the first layer 100 may not be decreased, or decreased to a lesser extent, by the presence of the second layer 200.

In an embodiment, the second curable composition may comprise a second reactive linear polyorganosiloxane. The concentration of the second reactive linear polyorganosiloxane in the second curable composition may, for example, range between 15 and 80 wt. %.

In an embodiment, the second curable composition may comprise a vinyl functionalised linear polyorganosiloxane, e.g. comprising a vinyl functionalised linear polyorganosiloxane according to Formula 6; a hydride functionalised linear polyorganosiloxane, e.g. comprising a hydride functionalised linear polyorganosiloxane according to Formula 7; and a hydrosilylation catalyst. The hydrosilylation catalyst may be the same as that used in the first curable composition, as previously described. The hydrosilylation catalyst may, for example, be employed in a concentration such that the concentration of metal (e.g. platinum) is less than 3 wt. %, such as less than 0.15 wt. % of the second curable composition. For example, the hydrosilylation catalyst may be employed in a concentration such that the concentration of metal (e.g. platinum) is less than 3 wt. %, such as between 0.01 and 3.0 wt. %. In non-limiting examples, the hydrosilylation catalyst may be employed in a concentration such that the concentration of metal (e.g. platinum) is in the range 0.01 to 0.06 wt. %, of the second curable composition.

The concentration of the vinyl functionalised polyorganosiloxane in the second curable composition may, for example, range between 10 and 60 wt. %. The concentration of the hydride functionalised polyorganosiloxane in the second curable composition may, for example, range between 5 and 20 wt. %.

In an embodiment, the second curable composition may further comprise a catalyst moderator which may be the same as that in the first curable composition described above. The catalyst moderator may assist controlling the curing of the second curable composition. In an embodiment, the catalyst moderator concentration in the second curable composition may be equal to or less than that of the first curable composition. This may assist to limit or prevent migration/diffusion of the moderator from the second layer 200 to the first layer 100 such that the degree of curing, hence the Young's modulus of the first layer 100 may not be decreased, or decreased to a more limited extent, by the presence of the moderator in the second curable composition. The moderator may, for example, be employed in a concentration of less than 5 wt. %, such as between 0.1 and 4.0 wt. %, of the second curable composition.

In an example, the second curable composition may comprise a vinyl functionalised linear polyorganosiloxane being at least 5% vinyl functional, for example, 6-10% vinyl functional.

In an embodiment, the second reactive linear polyorganosiloxane may further comprise a linear polyorganosiloxane comprising terminal vinyl groups, such as a polyorganosiloxane according to Formula 5.

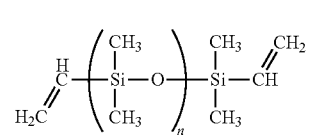

Formula 5 wherein n may, for example, range from 4 to 1000, such as from 4 to 500.

The second reactive linear polyorganosiloxane comprising a terminal vinylic linear polyorganosiloxane may assist in (chemical) adhesion of the second layer 200 to the first layer 100 and third layer 300 due to the terminal vinylic groups facilitating crosslinking with the first reactive linear polyorganosiloxane (i.e. at an interface between the first layer 100 and second layer 200), and crosslinking with the third reactive linear polyorganosiloxane (at a further interface between the second 200 and third 300 layers). The terminal vinylic linear polyorganosiloxane may, for example, be employed in the second curable composition in a concentration ranging from 10 to 20 wt. %.

The hydride functionalised linear polyorganosiloxane may, in non-limiting examples, comprise a mixture of hydride functionalised linear polyorganosiloxanes. The mixture may, for example, comprise a first hydride functionalised linear polyorganosiloxane which is at least 10% hydride functional, for example, 10-60% hydride functional, and a second hydride functionalised linear polyorganosiloxane which is less than 30% hydride functional. The first and second hydride functionalised linear polyorganosiloxane may, for example, be employed in a ratio of 70:30 to 30:70.

Upon curing of the second curable composition, the hydride functionalised linear polyorganosiloxanes may form crosslinks between the vinyl functionalised linear polyorganosiloxanes, such that a crosslinked structure may be attained. The crosslinked structure (but not with the extensive network as described for the first layer 100) of the cured second layer 200 may result in the second layer 200 having a lower (second) Young's modulus with respect to the (first) Young's modulus of the first layer 100. Whilst the completely cured first layer 100 may not, itself, be sufficiently flexible to be (chemically) adhered to a third (support) layer, the lower Young's modulus of the second layer 200 may render the second layer 200 sufficiently flexible to be (chemically) adhered to a third polyorganosiloxane layer 300.

The second layer 200 and third layer 300 may, in non-limiting examples, also comprise a branched reactive polyorganosiloxane. In such an example, the overall Young's modulus of the stamp 500 may increase. The amount of the branched reactive polyorganosiloxane in the second layer 200 may, for example, be less than in the first layer 100 such that the Young's modulus of the second layer 200 is less than that of the first layer 100. The amount of the branched reactive polyorganosiloxane in the third layer 300 may also be less than in the first layer 100 such that the Young's modulus of the third layer 300 may also be less than that of the first layer 100.

In an embodiment, the second curable composition may have a lower viscosity than the first curable composition which may assist in deposition of the thinner second layer 200 relative to the first layer 100. In an embodiment, this may be achieved by using a volatile diluent such as, for example, hexamethyldisiloxane. The volatile diluent may have a sufficiently high vapour pressure such that it evaporates during deposition of the second layer 200 (e.g. during spin coating) and/or co-curing. The volatile diluent may, for example, be employed in a concentration of up to 5 wt. % of the second curable composition.

In non-limiting examples, the second curable composition may include surface-functionalised inorganic particles. For example, the second curable composition may include surface-functionalised silica particles. The particles may, for example, be functionalised with at least one of trimethylsilyl groups and vinyldimethylsilyl groups. The nanoparticles may, for example, have a diameter in the range from 10 to 100 nm. Such inorganic particles may, for example, be present in the second curable composition in a concentration ranging from 5 to 12.5 wt. %.

A non-limiting example of a second curable composition is provided in Table 2. The concentrations in Table 2 are relative to the total weight of the second curable composition.

In a non-limiting example, the terminal vinylic linear polyorganosiloxane according to Formula 5 and the surface-functionalised inorganic particles may be added to the second curable composition together in a precursor composition. Such a precursor composition may, for example, comprise 40 to 50 wt. % of the overall second curable composition. Such a precursor composition may, for example, comprise a concentration of vinylic linear polyorganosiloxane according to Formula 5 of 25 to 38 wt. % of the precursor composition, and a surface-functionalised inorganic particles concentration of, for example, 14 to 25 wt. % of the precursor composition. In a non-limiting example, the precursor composition may include Sylgard® 184A from Dow Corning.

In a non-limiting example, the second layer 200 may be deposited on the partially cured first layer 100 using a spin coating technique: the lower viscosity of the second curable composition may assist in causing more of the second curable composition to run off the edge of the partially cured first layer 100 such that a thinner second layer 200 may be attained.

Step (e) of FIG. 1 schematically depicts deposition of a third layer 300 of a third curable composition on the second layer 200. The third layer 300 may be applied to the second layer 200 in any suitable manner, e.g. spin coating, dip coating, casting, ink jet printing and so on.

In an embodiment, the third curable composition may comprise a third reactive linear polyorganosiloxane. In an embodiment, the third curable composition may comprise a further mixture comprising a further vinyl functionalised linear polyorganosiloxane and a further hydride functionalised linear polyorganosiloxane, and a further hydrosilylation catalyst. Thus, similarly to the curing process previously described for the second layer 200, the third curable composition may be cured by metal (e.g. platinum) catalysed hydrosilylation.

The concentration of vinyl functionalised polyorganosiloxane in the third curable composition may, for example, range between 85 and 99 wt. %. The concentration of hydride functionalised polyorganosiloxane in the third curable composition may, for example, range between 1 and 15 wt. %.

In non-limiting examples, the third curable composition may include surface-functionalised inorganic particles. For example, the second curable composition may include surface-functionalised silica particles. The nanoparticles may, for example, have a diameter in the range from 10 to 100 nm. The particles may, for example, be functionalised with at least one of trimethylsilyl groups and vinyldimethylsilyl groups.

In non-limiting examples, the third curable composition may comprise the commercially available polyorganosiloxane compositions: Sylgard® 184 from Dow Corning or Wacker Elastosil® 601 from Wacker Chemie AG.

TABLE 2

| Terminal vinylic linear polyorgano-siloxane according to Formula 5 | Surface-functionalised inorganic particles | Vinyl functionalised linear polyorgano-siloxanes according to Formula 6 | Hydride functionalised linear polyorgano-siloxanes | Moderator | Catalyst (metal content) | Diluent |
|---|---|---|---|---|---|---|
| 10-20 wt. % | 5.5-12.5 wt. % | 0-40 wt. % | 5-20 wt. % | 0.1-4.0 wt. % | 0.01-3.0 wt. % | 0-5.0 wt. % |

The third layer 300 may be cured (not shown in FIG. 1) such that the third layer 300 and the second layer 200 may become (chemically) adhered to each other due to formation of inter-layer crosslinking between the reactive linear polyorganosiloxanes in the respective layers (i.e. at a further interface between the third layer 300 and the second layer 200). Owing to the lower Young's modulus of the second layer 200 compared to the first layer 100, the second layer 200 is more flexible than the first layer 100. This increased flexibility allows for more reactive groups involved in the crosslinking reaction to reorganize at the further interface upon deformation of the second layer 200, which allows for increased chemical adhesion between the second layer 200 and the third layer 300.

In an example, the third layer 300 may comprise a vinyl functionalised linear comprising a terminal vinylic linear polyorganosiloxane. The terminal vinylic linear polyorganosiloxane may assist in adhering of the third layer 300 to the (cured) second layer 200 by assisting crosslinking with the second reactive linear polyorganosiloxane which may, for example, also comprise a terminal vinylic linear polyorganosiloxane (at a further interface between the second 200 and third 300 layers).

In a non-limiting example, the third curable composition may be the same as the second curable composition. In such an example, the stamp 500 may be considered to comprise two compositionally distinct layers: the first (stamp) layer 100 and another softer (lower Young's modulus) layer comprising the second layer 200 and the third layer 300.

In an embodiment, the Young's modulus of the first layer 100 may be higher than that of the third layer 300. A lower Young's modulus third (support) layer 300 (relative to the higher Young's modulus first layer 100) may assist to compensate for the brittleness, if present, of the high Young's modulus first layer 100, e.g. by absorbing most of the (downward) forces applied to the stamp 500 when forcing the stamp 500 into intimate contact with a surface to be imprinted, e.g. a planar or contoured surface, thereby protecting the first layer 100 from being damaged.

In an embodiment, the first 100, second 200 and third 300 layers may be fixed to a rigid carrier 400; the third layer 300 being disposed between the rigid carrier 400 and the second layer 200. Fixing to a rigid carrier 400 may lend the stamp 500 further structural integrity and reduce the risk of stamp deformation in the X-Y plane (i.e. the plane of the surface of the third layer 300 receiving the carrier). The rigid carrier may, however, have some flexibility in the Z-direction to assist/accommodate pressing of the stamp 500 in the Z direction during use. The rigid carrier 400 may comprise, for example, a glass or polymer material possessing the requisite rigidity with respect to deformation in the X-Y plane.

Whilst step (e) of FIG. 1 schematically depicts deposition of the third layer 300 with the rigid carrier 400 already attached to the third layer 300, this is not intended to be limiting. For example, alternatively the rigid carrier 400 may be adhered to the third layer 300 after curing of the third layer 300 while deposited on the second layer 200.

Step (f) of FIG. 1 schematically depicts release of the polyorganosiloxane-based stamp 500 from the master 50 by disconnection of the first layer 100 from the pattern 52. However, it should be understood that disconnection of the first layer 100 from the pattern 52 does not necessarily represent the final step of the manufacturing method of the polyorganosiloxane-based stamp 500.

For example, the first layer 100 may be disconnected from the pattern 52 following co-curing (step (d)) of the partially cured first layer 100 and the second layer 200. The combined first layer 100 and second layer 200 may then be transferred to a different substrate (not shown in FIG. 1) before application of the third layer 300.

In a non-limiting example, the transfer pattern surface 52 may comprise a contoured surface such that the first layer 100 may comprise a contoured patterned surface. In such an example, the different substrate may be a contoured substrate (not shown in FIG. 1) which may comprise contours which may resemble those of the transfer pattern surface 52.

Deposition of the third layer 300 onto the second layer 200, while the contoured first layer 100 is in conformal contact with the contoured substrate may assist in supporting and retaining the contoured shape of the first layer 100 which may complement, in some respects, the contoured surface of the substrate.

In a further non-limiting example, the contoured first layer 100 may be disconnected from the (contoured) pattern 52 following deposition of the third curable composition. The combined first layer 100, second layer 200 and (pre-cured) third layer 300 (comprising the third curable composition) may be transferred to a different substrate (not shown in FIG. 1), which may comprise contours which may resemble those of the transfer pattern surface 52, before curing of the third layer 300 while the first layer 100 is in conformal contact with the substrate thereby assisting the first layer 100 to retain the contoured shape imposed by the contoured substrate as previously described. A variant of this procedure may, for example, involve a cured third layer 300 comprising a porous structure. The combined first layer 100, second layer 200 and porous third layer 300 may be transferred to a contoured substrate, the pores of the third layer 300 may be filled with a pore-filling curable composition, and the pore-filling composition may be cured while the first layer 100 is in conformal contact with the contoured substrate. In this way, a polyorganosiloxane-based stamp 500 with a contoured first (stamp) layer 100, with a contoured shape-retaining third layer 300 may be attained.

Such polyorganosiloxane-based stamps 500 comprising a contoured first layer 100 may be particularly useful for patterning contoured surfaces (i.e. surfaces which resemble the contoured surface of the substrate). In each case, the second layer 200 ensures attainment of a predictable, high Young's modulus for the first layer 100 whilst allowing adhesion to the third layer 300, regardless of the particular order which is employed in terms of applying the third layer 300 and/or releasing the first layer 100 from the master 50.

In an experiment, 4 stamps 500 were fabricated and the Young's modulus of the first layer 100 of each of the stamps was measured.

For each of the stamps 500, the first curable composition was prepared by mixing a two component (A+B) polyorganosiloxane curing system. Component A comprised a linear vinyl functionalised (7-8% vinyl content) polyorganosiloxane (ca. 55 wt. % of Component A), a Q-branched vinyl functionalised polyorganosiloxane component according to Formula 3 (ca. 44 wt. % of Component A), a Pt catalyst comprising a compound of Formula 1 complexed to Pt(0) ([Pt] is ca. 0.03-0.06 wt. % of Component A), and a catalyst moderator according to Formula 1 (ca. 2-4 wt. % of Component A). Component B comprised a linear hydride functionalised (30-55% hydride content) polyorganosiloxane (ca. 100 wt. % of Component B) for crosslinking the vinyl functionalised polyorganosiloxane components of Component A. The ratio of Component A:Component B was 1:0.31.

The second curable composition was prepared by mixing a further two component (C+D) polyorganosiloxane curing system (Sylgard® 184 from Dow Corning). Component C comprised a linear vinyl functionalised (7-8% vinyl content) polyorganosiloxane according to Formula 6 (ca. 36 wt. % of Component C), a terminal vinyl functionalised polyorganosiloxane component according to Formula 5 (ca. 54 wt. % of Component C), a Pt catalyst comprising a compound of Formula 1 complexed to Pt(0) ([Pt] is ca. 0.1-3 wt. % of Component C), a catalyst moderator according to Formula 1 (ca. 2-4 wt. % of Component C), and hexamethyldisiloxane (4.5 wt. % of Component C) as a volatile diluent. Component D comprised a linear hydride functionalised (<30% hydride content) polyorganosiloxane (ca. 32 wt. % of Component D) and a further linear hydride functionalised (ca. 30% hydride content) polyorganosiloxane (ca. 68 wt. % of Component D) for crosslinking the vinyl functionalised polyorganosiloxane components of Component C. The second curable composition comprised less than 20 wt. % trimethylsilyl- and vinyldimethylsilyl-functionalised silica nano-particles (10-100 nm diameter). The ratio of Component C:Component D was 1:0.18.

The first curable composition was applied to the middle of a transfer pattern surface on a master. The first layer 100 was formed by spin coating the first curable composition. The spin coating was achieved by employing an initial (5 to 15 second) high acceleration (e.g. 2000 rpm/s) to ensure immersion of the pattern. This was followed by a use of a speed of 1000-2000 rpm for 5 to 15 seconds to ensure a uniform thickness of the first layer 100 of 5 to 70 µm.

The first layer 100 was then partially cured at 30-50° C. for a time period between 30 seconds and 30 minutes until the first layer 100 reached a thick gel/soft-solid state and is still tacky.

The second curable composition was then applied to the middle of the partially cured first layer 100. The second layer 200 was formed by spin coating the second curable composition. The spin coating was achieved by employing an initial (5 to 15 second) moderate acceleration (e.g. 1000 rpm/s) followed by a use of a speed of 1000-2000 rpm for 60 seconds to ensure a uniform thickness of the second layer 200 which is thinner than the first layer 100. It was observed that spinning for longer periods than 60 seconds did not appear to result in a significantly thinner second layer 200.

The first 100 and second 200 layers were then co-cured at various temperature and time conditions. A third layer 300 of a third polyorganosiloxane composition comprising a soft-PDMS composition was then adhered to the second layer 200 for each stamp and the third layer 300 was also cured such that the second layer 200 was adhered to the cured third layer 300. The third polyorganosiloxane composition was the same as the second curable composition.

The Young's modulus of the first layer 100 of each of the stamps 500 was measured using a pico-indentation method whereby the indentation depth did not exceed 10% of the thickness of the high modulus layer. Further details for measuring the Young's modulus by the pico-indentation method are provided in Cappella et al. in Surface Science Reports 59 (2005) pages 1-152, and Cleveland et al. in Reviews in Scientific Instruments 64 (2) 1993 pages 403-405. It was further confirmed in comparative tests that the Young's modulus as measured by ASTM D1415-06(2012) yields the same value as for the pico-indentation method employed in these examples. The results are tabulated below in Table 3:

TABLE 3

| Stamp No. | Catalyst (Pt) conc in 2$^{nd}$ layer/wt. % | Co-curing time | Temperature/° C. | Young's Modulus/MPa |
| --- | --- | --- | --- | --- |
| 1 | 0.14 | 1 day | 70 | 48 |
| 2 | 0.14 | 1 day | 90 | 49 |
| 3 | 2 | 1 day | 90 | 56 |
| 4 | 0.14 | 5 days | 90 | 52 |

The results indicate that a high Young's modulus first layer 100 may be attained by co-curing of the second layer 200 with the partially cured first layer 100. The results further confirm that increasing the catalyst concentration in the second curable composition further increases the Young's modulus of the first layer 100 and reduces the curing time to reach a desired high Young's modulus.

Figure 2:
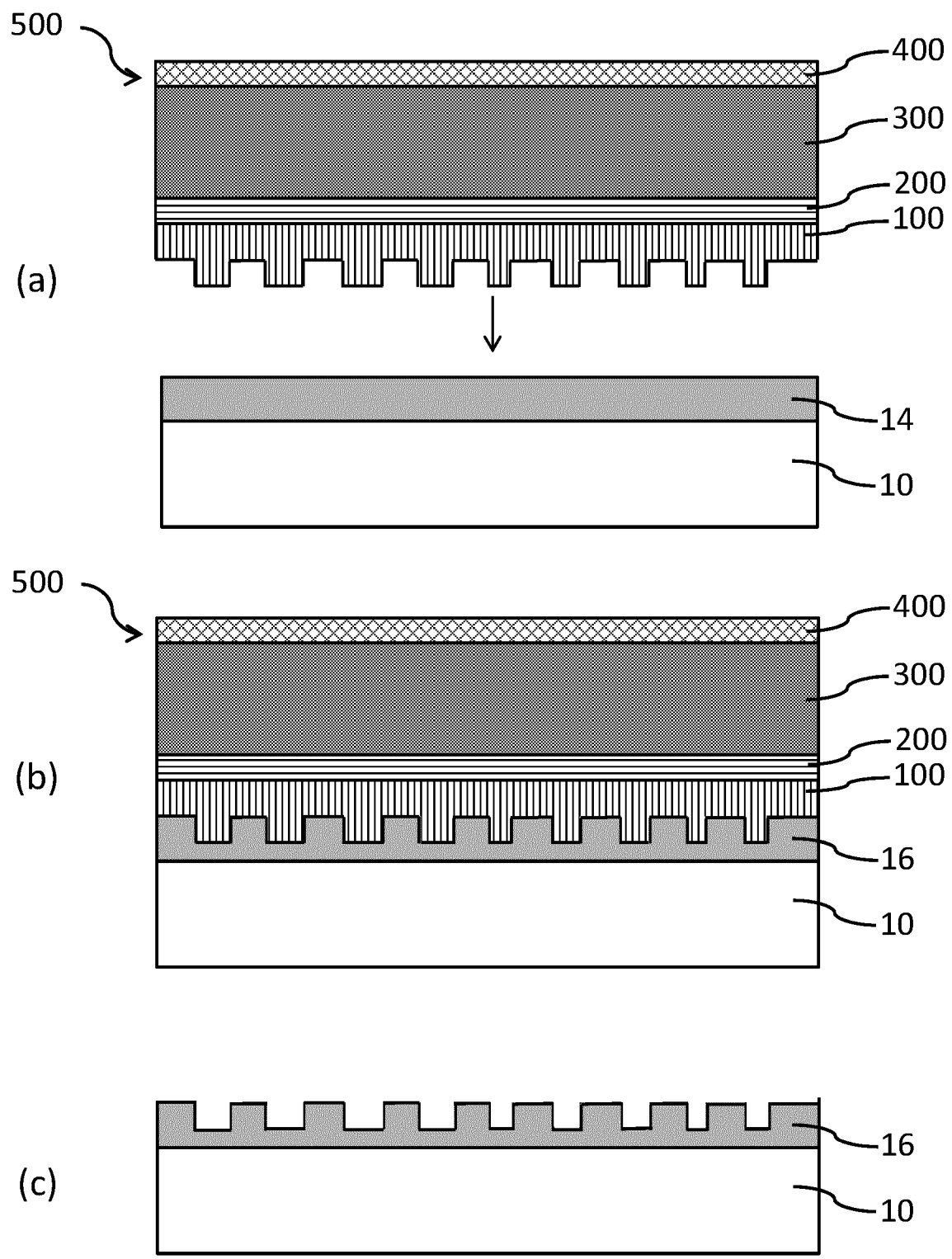
FIG. 2 schematically depicts an imprinting method according to an embodiment of the present invention.

An example embodiment of an imprinting method in accordance with an aspect of the present invention is shown in FIG. 2. In step (a), a receiving substrate 10 is provided together with an embodiment of the polyorganosiloxane-based stamp 500 of the present invention. An ink or resist precursor layer 14 to be imprinted by the polyorganosiloxane-based stamp 500 is provided on the receiving substrate 10 in any suitable manner, e.g. by spray coating, ink-jet printing or nebula/ultrasonic fog-generated coating. The ink or resist precursor layer 14 may be any suitable material, e.g. an organic or inorganic resist precursor material. As such materials are well-known per se and widely documented, a further description of the compositions of such materials is omitted for the sake of brevity only. Any suitable material may be used for the receiving substrate 10, e.g. glass, a suitable polymer, a metal, a semiconductor material such as Si, SiGe, AlGaN, and so on.

In step (b), the ink or resist layer 14 is imprinted with the polyorganosiloxane-based stamp 500 and subsequently developed, e.g. solidified through a curing reaction, to form the patterned ink or resist layer 16 on the receiving substrate 10, after which the polyorganosiloxane-based stamp 500 is removed in step (c) to yield an article comprising a substrate 10 carrying a patterned ink or resist layer 16. Such an article may benefit from the fact that the pattern on the receiving substrate 10 may be of high quality due to the high Young's modulus of the first layer 100 which may assist in precise transfer of fine patterns (e.g. with nanoscale-sized features).

Figure 3:
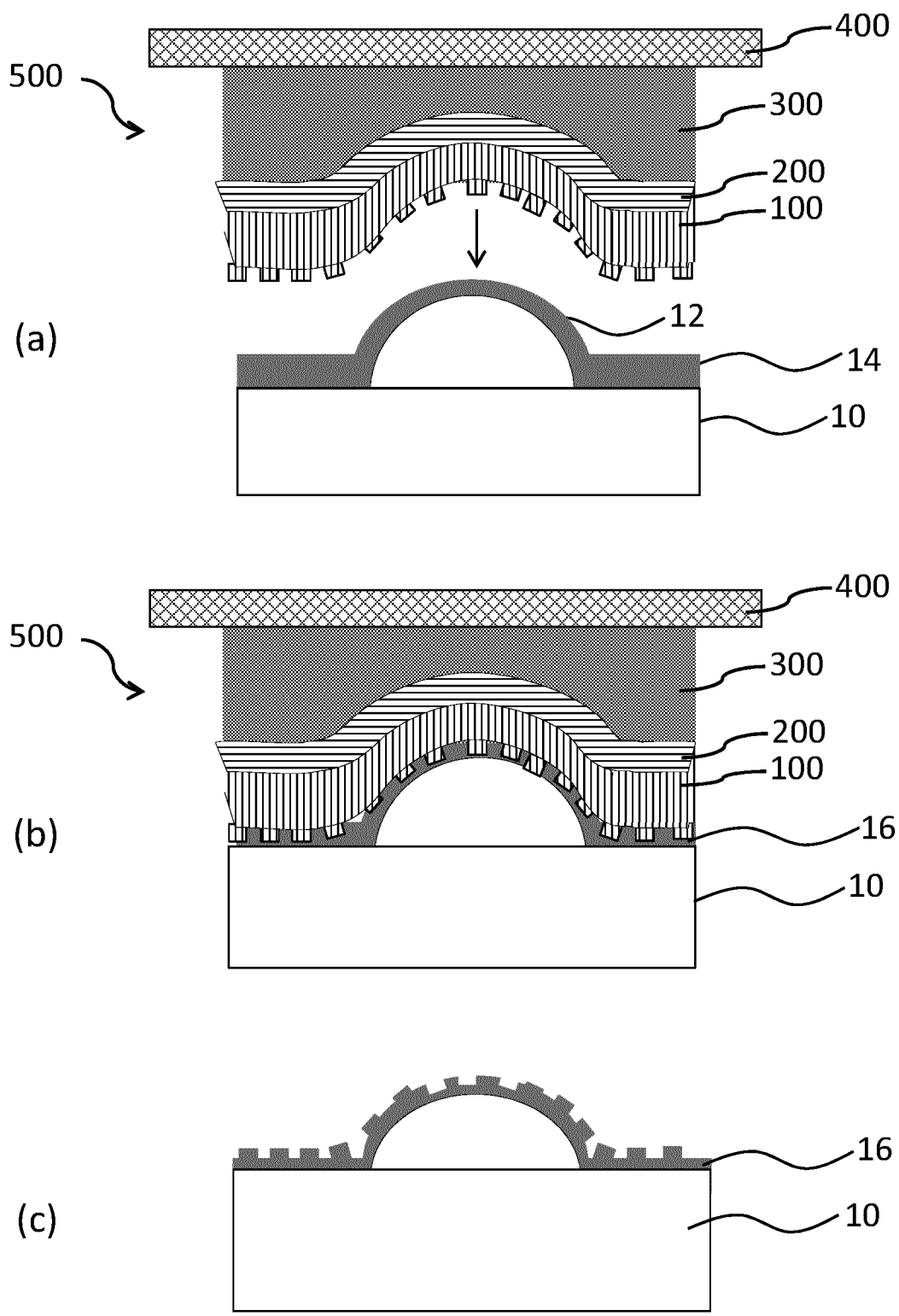
FIG. 3 schematically depicts an imprinting method according to another embodiment of the present invention.

At this point it is noted that the imprinting method of the present invention is not limited to imprinting planar receiving substrates only. In a non-limiting example, the receiving substrate 10 to be imprinted may comprise a contoured surface as shown in FIG. 3. In step (a), a receiving substrate 10 comprising one or more contours 12 is provided together with an embodiment of the polyorganosiloxane-based stamp 500 of the present invention. An ink or resist precursor layer 14 to be imprinted by the polyorganosiloxane-based stamp 500 is provided on the contoured substrate 10 in any suitable manner, e.g. by spray coating, ink-jet printing or nebula/ultrasonic fog-generated coating. The ink or resist precursor layer 14 may be any suitable material, e.g. an organic or inorganic resist precursor material. As such materials are well-known per se and widely documented, a further description of the compositions of such materials is omitted for the sake of brevity only. Similarly, the material used for the contoured substrate 10 is not particularly limited. Any suitable material may be used for the contoured receiving substrate 10, e.g. glass, a suitable polymer, a metal, a semiconductor material such as Si, SiGe, AlGaN, and so on.

It is noted that the contoured substrate 10 to be imprinted shown in FIG. 3 may match the contours of a contoured master 50 (not shown in FIG. 3) used to form the stamp 500, thereby ensuring that the contoured surface of the patterned stamp 500 complements the shape of the contoured substrate 10 upon correct alignment, including the boundary regions of the contours 12. In this way the stamp 500 may more faithfully replicate the pattern on the contoured receiving substrate 10 by allowing greater conformal contact between the first layer 100 and the receiving substrate 10.

Figure 4:
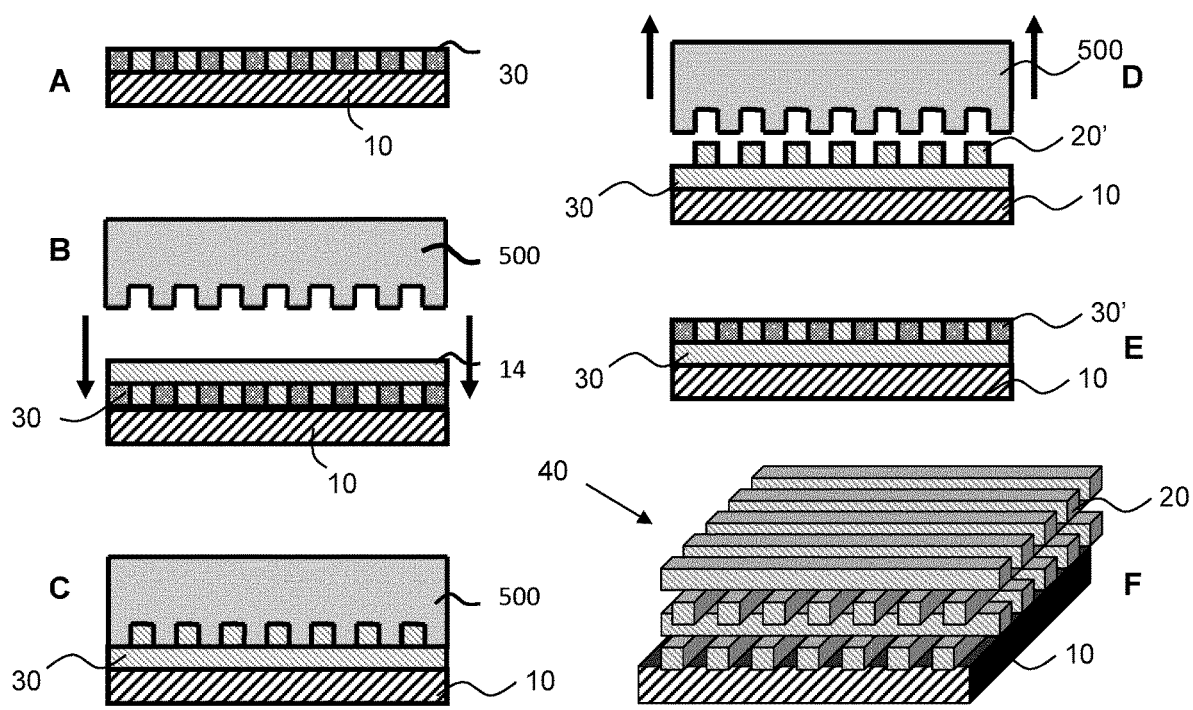
FIG. 4 schematically depicts an imprinting method according to yet another embodiment of the present invention.

A further non-limiting example of a method of manufacturing a three-dimensional structure is shown in FIG. 4. In step A, a planarised layer 30 is formed on a receiving substrate 10. The patterned portions 20 of the planarised layer 30 may be produced by using a curable imprinting ink 14. The pattern 20 is filled, i.e. planarised with a filling material 22. In step B, a next layer of the curable imprinting ink 14 is applied over the planarised layer 30 of step A in any suitable manner, e.g. by spin coating, dispensing or doctor blading.

The curable imprinting ink 14 deposited in step B is subsequently embossed by the polyorganosiloxane-based stamp 500 after alignment of the stamp with respect to the receiving substrate 10, as shown in step C. In step C, the imprint orientation of the stamp 500 with the receiving substrate 10 has been rotated 90° with respect to the imprint orientation used to form the first patterned layer 20. It will be appreciated that other orientation rotation angles are equally feasible.

The curable imprinting ink 14 is subsequently solidified (densified) to form solidified portions 20' as shown in step D. The formation of the solidified portions 20' may be completed after removal of the stamp 500. Removing the stamp 500 may leave the densified portions 20' on the planarised layer 30 of step A. The newly formed patterned layer may again be planarised as shown in step E, after which additional layers may be formed by repeating the steps B-E.

The height of the patterned portions of the patterned layer may be reduced using an additional processing step, e.g. by means of reactive ion etching. The filling material 22 can be removed afterwards by e.g. dissolving the filling material 22 in a suitable solvent or by thermal decomposition, thus yielding a stacked structure 40 as shown in step F.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

Any reference signs in the claims should not be construed as limiting the scope.

The invention claimed is:

1. A method of manufacturing a polyorganosiloxane based stamp, the method comprising:
   forming a first layer of a first curable composition onto a transfer pattern surface of a master such that the first layer includes a relief pattern of the transfer pattern surface, the first layer having a first thickness, the first curable composition comprising:
   reactive branched polyorganosiloxane,
   a first reactive linear polyorganosiloxane, and
   a first concentration of a catalyst, wherein the first concentration of the catalyst is arranged to catalyze crosslinking of the reactive branched polyorganosiloxane and the first reactive linear polyorganosiloxane;
   partially curing the first layer;
   depositing a second layer of a second curable composition onto the partially cured first layer, the second layer having a second thickness, the second curable composition comprising:
   a second concentration of the catalyst, and
   a second reactive linear polyorganosiloxane, wherein the second reactive linear polyorganosiloxane is arranged to adhere the second layer to the first layer by crosslinking with the crosslinked reactive branched and linear polyorganosiloxanes of the partially cured first layer,
   wherein the second thickness is selected to be smaller than the first thickness and the second concentration is selected to be equal to or greater than the first concentration;
   completely co-curing the partially cured first layer and the second layer to form a cured first layer adhered to a cured second layer,
   wherein the cured first layer has a first Young's modulus,
   wherein the cured second layer has a second Young's modulus,
   wherein the second Young's modulus is smaller than the first Young's modulus;
   depositing a third layer of a third curable composition onto the cured second layer, the third curable composition comprising:
   a third reactive polyorganosiloxane, wherein the third reactive polyorganosiloxane is arranged to adhere the third layer to the cured second layer by crosslinking with the second reactive linear polyorganosiloxane; and
   curing the third layer to form a cured third layer adhered to the cured second layer.

2. The method of claim 1, wherein the first thickness is in a range 5 μm to 70 μm and the first Young's modulus is in a range from 30 MPa to 100 MPa.

3. The method of claim 1,
   wherein the reactive branched polyorganosiloxane comprises:
   a vinyl functionalised branched polyorganosiloxane;
   a hydride functionalised branched polyorganosiloxane; or
   a mixture of both,
   wherein the first reactive linear polyorganosiloxane and the second reactive linear polyorganosiloxane each comprise a mixture of a vinyl functionalised linear polyorganosiloxane and a hydride functionalised linear polyorganosiloxane,
   wherein the catalyst comprises a hydrosilylation catalyst.

4. The method of claim 3,
   wherein the hydrosilylation catalyst comprises platinum,
   wherein the first and second curable compositions further comprise a catalyst moderator comprising a cyclic vinyl functionalised polyorganosiloxane.

5. The method of claim 4, wherein the second curable composition comprises a catalyst moderator concentration which is equal to or less than that of the first curable composition.

6. The method of claim 1, wherein the reactive branched polyorganosiloxane comprises a T-branched polyorganosiloxane, a Q-branched polyorganosiloxane, or a mixture thereof.

7. The method of claim 1, wherein the second reactive linear polyorganosiloxane comprises a linear polyorganosiloxane comprising terminal vinyl groups.

8. The method of claim 1, wherein the second curable composition has a lower viscosity than the first curable composition.

9. The method of claim 1, wherein the third reactive polyorganosiloxane comprises a mixture comprising a vinyl functionalised linear polyorganosiloxane and a hydride functionalised linear polyorganosiloxane, and a hydrosilylation catalyst.

10. The method of claim 1, further comprising:
fixing the polyorganosiloxane based stamp to a rigid carrier, wherein the third layer is disposed between the rigid carrier and the second layer.

11. The method of claim 1, wherein the second curable composition further comprises another reactive branched polyorganosiloxane, which comprises a T-branched polyorganosiloxane, a Q-branched polyorganosiloxane, or a mixture thereof.

12. The method of claim 1, wherein the second Young's modulus of the cured second layer renders the second layer sufficiently flexible to be adhered to the third layer.

13. The method of claim 4, wherein the catalyst moderator comprises a cyclic polyorganosiloxane according to Formula 1, Formula 2 or a mixture thereof.

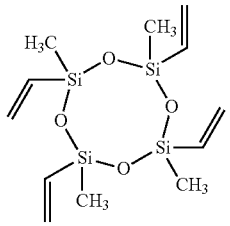

Formula 1

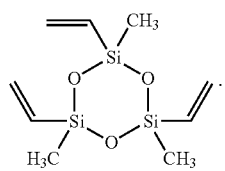

Formula 2

14. The method of claim 11, wherein the reactive branched polyorganosiloxane comprises a polyorganosiloxane according to Formula 3, Formula 4, or a mixture thereof;

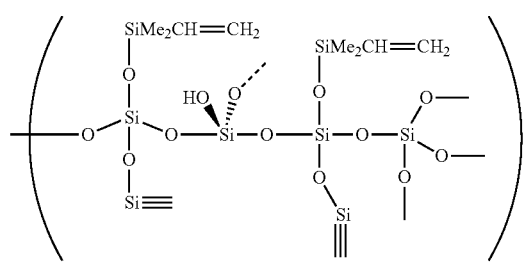

Formula 3

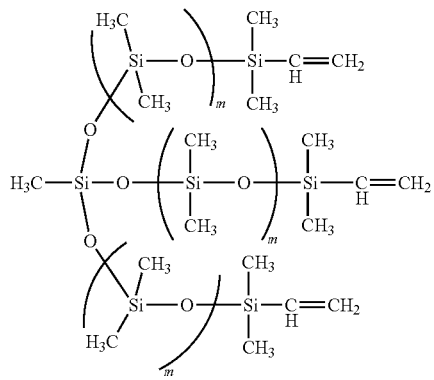

Formula 4 wherein m ranges from 3 to 13.

15. The method of claim 6, wherein the reactive branched polyorganosiloxane comprises a polyorganosiloxane according to Formula 3, Formula 4, or a mixture thereof;

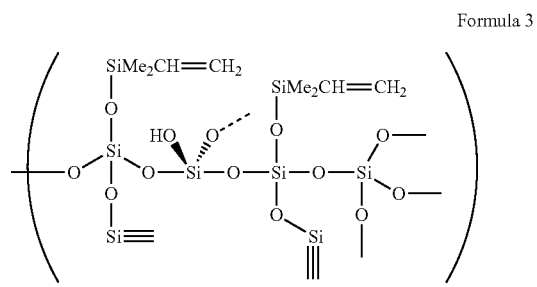

Formula 3

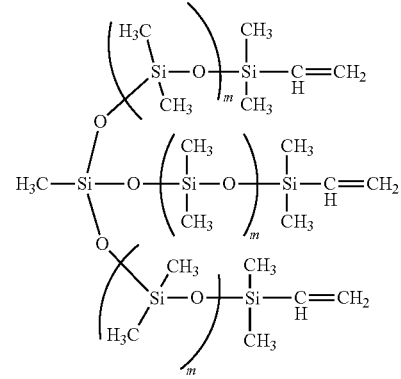

Formula 4 wherein m ranges from 3 to 13.

16. The method of claim 7 wherein the second reactive linear polyorganosiloxane comprises a polyorganosiloxane according to Formula 5;

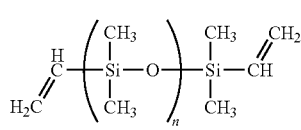

Formula 5 wherein n ranges from 4 to 1000.

17. The method of claim 8, wherein the second curable composition further comprises a volatile diluent for decreasing the viscosity of the second curable composition and which is evaporable during the depositing of the second curable composition and/or during the co-curing.

18. A method of manufacturing a polyorganosiloxane-based stamp, the method comprising:

forming a first layer of a first curable composition onto a transfer pattern surface of a master such that the first layer includes a relief pattern of the transfer pattern surface, the first layer having a first thickness, the first curable composition comprising:

reactive branched polyorganosiloxane, a first reactive linear polyorganosiloxane, and a first concentration of a catalyst, wherein the first concentration of the catalyst is arranged to catalyze crosslinking of the reactive branched polyorganosiloxane and the first reactive linear polyorganosiloxane;

partially curing the first layer;

depositing a second layer of a second curable composition onto the partially cured first layer, the second layer having a second thickness, the second curable composition comprising:

a second concentration of the catalyst, a second reactive linear polyorganosiloxane, wherein the second reactive linear polyorganosiloxane is arranged to adhere the second layer to the first layer by crosslinking with the crosslinked reactive branched and linear polyorganosiloxanes of the partially cured first layer, wherein the second thickness is selected to be smaller than the first thickness or the second concentration is selected to be equal to or greater than the first concentration;

completely co-curing the partially cured first layer and the second layer to form a cured first layer adhered to a cured second layer, wherein the cured first layer has a first Young's modulus, wherein the cured second layer has a second Young's modulus, wherein the second Young's modulus is smaller than the first Young's modulus;

depositing a third layer of a third curable composition onto the second layer, the third curable composition comprising:

a third reactive polyorganosiloxane, wherein the third reactive polyorganosiloxane is arranged to adhere the third layer to the cured second layer by crosslinking with the second reactive linear polyorganosiloxane; and curing the third layer to form a cured third layer adhered to the cured second layer.

* * * * *